(12) United States Patent
Tsai et al.

(10) Patent No.: US 11,980,076 B2
(45) Date of Patent: May 7, 2024

(54) TILED DISPLAY DEVICE

(71) Applicant: InnoLux Corporation, Miao-Li County (TW)

(72) Inventors: Ping-Hsun Tsai, Miao-Li County (TW); Shih-Fu Liao, Miao-Li County (TW); I-An Yao, Miao-Li County (TW); Yu-Chun Hsu, Miao-Li County (TW); Yung-Hsun Wu, Miao-Li County (TW); Sheng-Nan Fan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 637 days.

(21) Appl. No.: 17/134,146

(22) Filed: Dec. 24, 2020

(65) Prior Publication Data

US 2021/0225997 A1     Jul. 22, 2021

Related U.S. Application Data

(60) Provisional application No. 63/009,472, filed on Apr. 14, 2020.

(30) Foreign Application Priority Data

Jan. 22, 2020  (CN) .......................... 202010075267.2
Nov. 4, 2020  (CN) .......................... 202011217617.0

(51) Int. Cl.
*H10K 59/18*     (2023.01)
*H10K 50/84*     (2023.01)
*H10K 50/844*    (2023.01)

(52) U.S. Cl.
CPC ........... *H10K 59/18* (2023.02); *H10K 50/841* (2023.02); *H10K 50/844* (2023.02)

(58) Field of Classification Search
CPC ....... H10K 59/18; G09F 9/301; G09F 9/3023; G09G 3/035; G09G 3/03
See application file for complete search history.

(56) References Cited

U.S. PATENT DOCUMENTS

| | | | |
|---|---|---|---|
| 8,472,114 B2 | 6/2013 | Watanabe | |
| 8,692,737 B2 | 4/2014 | Watanabe | |
| 2012/0113614 A1* | 5/2012 | Watanabe | G02F 1/13336 361/810 |
| 2019/0025623 A1* | 1/2019 | Hirata | G02F 1/136209 |

FOREIGN PATENT DOCUMENTS

| | | |
|---|---|---|
| CN | 102067196 | 4/2014 |
| CN | 104751747 A | 7/2015 |
| CN | 107742480 A | 2/2018 |

\* cited by examiner

*Primary Examiner* — Dennis P Joseph
(74) *Attorney, Agent, or Firm* — Winston Hsu

(57) ABSTRACT

A tiled display device includes two panels and two cover layers respectively disposed on the two panels. The two cover layers include a contact region. A top portion and a bottom portion of the contact region have a height H. One of the two cover layers has a thickness Tn. One of the two panels has a distance Xn between an upper surface of the one of the two panels and the bottom portion of the contact region. The one of the two panels is corresponding to the one of the two cover layers. The height H, the thickness Tn and the distance Xn satisfy the equation: $0 \leq H/(Xn+Tn) < 0.8$.

10 Claims, 10 Drawing Sheets

TILED DISPLAY DEVICE

CROSS REFERENCE TO RELATED APPLICATION

This application claims the benefit of U.S. Provisional Application Ser. No. 63/009,472 filed at Apr. 14, 2020, and the entire contents of which are incorporated herein by reference.

BACKGROUND OF THE DISCOSLURE

1. Field of the Disclosure

The present disclosure relates to a display device, and more particularly relates to a tiled display device.

2. Description of the Prior Art

The planar display device has the advantages of being lightweight and thin in thickness, and has gradually become the mainstream products in the display device market. The foldable planar display device has been proposed in the field for the needs of being portable and a larger display region.

It is known that a tiled display device may have a larger display region by tiling two or more panels. However, the peripheral regions of the tiled panels may cause obvious dark regions, image distortions or color shifts near the splice region of the tiled display devices, which may reduce the display quality.

SUMMARY OF THE DISCLOSURE

One aspect of the present disclosure is to provide a tiled display device, which may reduce the impact of observing the dark region between the tiled panels of the tiled display device. Therefore, the display quality may be improved.

In one embodiment of the present disclosure, a tiled display device is provided. The tiled display device includes two panels and two cover layers respectively disposed on the two panels. The two cover layers comprise a contact region. A top portion and a bottom portion of the contact region have a height H. One of the two cover layers has a thickness $T_n$. One of the two panels has a distance $X_n$ between an upper surface of the one of the two panels and the bottom portion of the contact region. The one of the two panels is corresponding to the one of the two cover layers. The height H, the thickness $T_n$ and the distance $X_n$ satisfy the equation: $0 \leq H/(X_n+T_n) < 0.8$.

In one embodiment of the present disclosure, a tiled display device is provided. The tiled display device includes two panels and two cover layers respectively disposed on the two panels. One of the two panels comprises a plurality of pixels of a same color being arranged along a first direction. The two cover layers have a contact region extending along a second direction. The first direction and the second direction are perpendicular.

In one embodiment of the present disclosure, a tiled display device is provided. The tiled display device includes a first panel, a second panel, a first cover layer and a second cover layer. The first cover layer is disposed on the first panel. The second cover layer is disposed on the second panel. The first cover layer and the second cover layer have a contact region. A length of the first cover layer is larger than a length of the second cover layer.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. The drawings in this disclosure are not drawn to scale unless being specifically specified. For clarity of presentation, the drawings are simplified and some details or elements are omitted.

DETAILED DESCRIPTION

Figure 1:
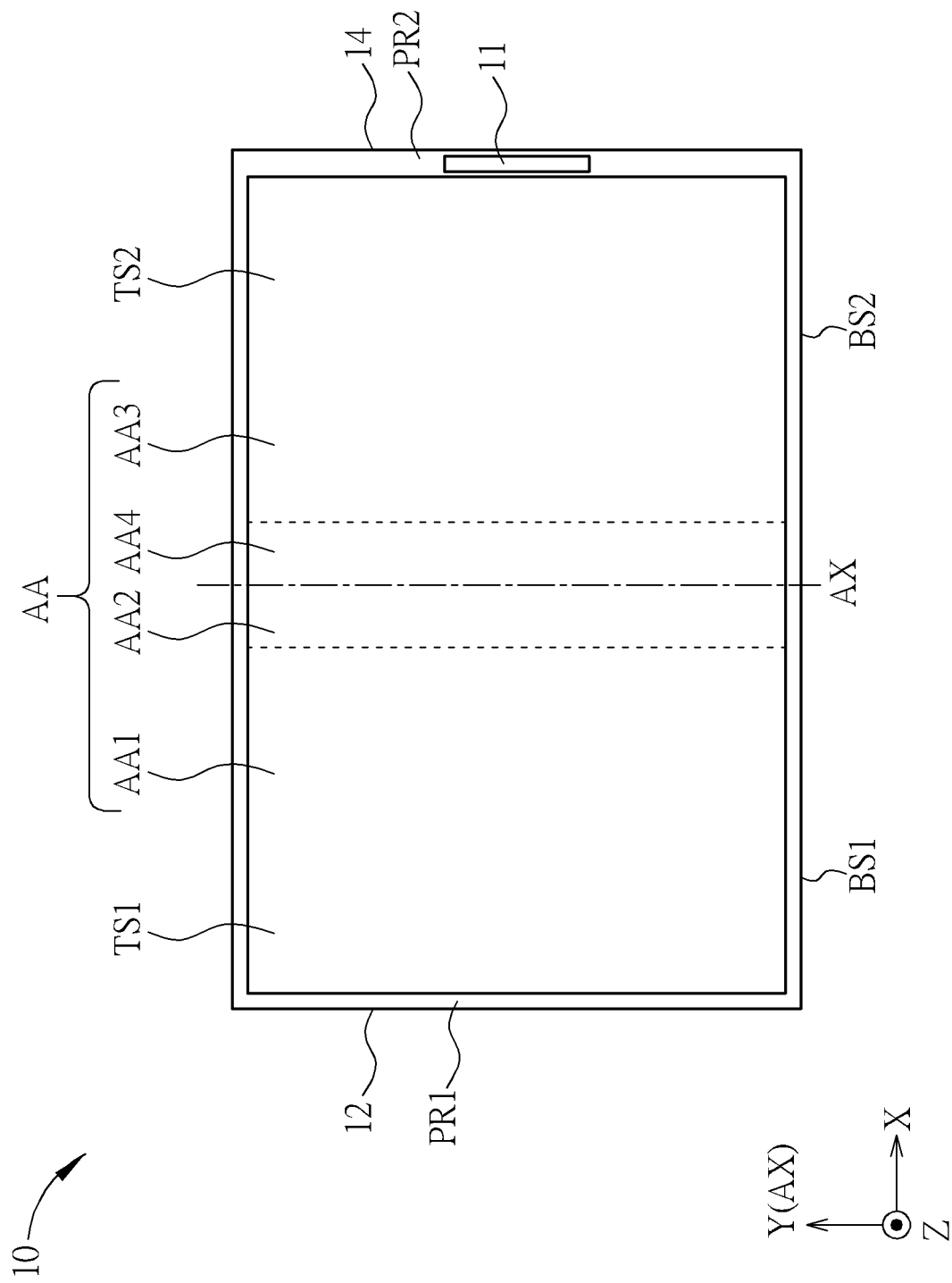
FIG. 1 is a schematic plan view of a tiled display device in an unfolded form according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". It will be understood that when a component is referred to as being "connected to" another component (or its variant), it may be directly connected to the "another component", or connected to the "another component" through one or more intervening components.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

Although the terms such as first, second, etc., may be used in the description and following claims to describe various components in claims, these terms does not mean or represent the claimed components have order and does not represent the order of one claimed component and another one claimed component, or the sequence in manufacturing method. These terms are used to discriminate a claimed component with a denomination from another one claimed component with the same denomination.

It should be noted that the technical features in different embodiments described in the following description may be replaced, recombined, or mixed with one another to constitute another embodiment without departing from the spirit of the present disclosure.

The foldable display device of the present disclosure may be a curved display device or a flexible display device, wherein the flexible display device includes those that may be transformed by being bent, warped, folded, stretched, flexed or other types of transforming operations, and are referred to as "foldable display devices" in the present disclosure. In other words, during operation, the display device may have a curved surface or be in a bent state.

Embodiments of the foldable display device disclosed herein may be a non-self-light-emitting liquid crystal display (liquid crystal display, LCD) or a self-light-emitting display. The self-light-emitting display may be organic light-emitting diode display (OLED display), inorganic light-emitting diode display (LED display), mini-LED display, micro-LED display, quantum-dot LED display (QLED display), electrophoretic display (EPD), or other types of displays that may show images and pictures, but is not limited thereto.

FIG. 1 is a schematic plane view of a tiled display device 10 in an unfolded form from a front view direction (the Z direction) according to an embodiment of the present disclosure. The tiled display device 10 may be applied to various transformable electronic devices, such as mobile phones, mobile personal computers, antennas, lighting devices, electronic books, and electronic papers, but not limited thereto. It should be noted that the number of panels, for example, two panels included in the tiled display device 10 is not limited to the illustrated embodiment. In practical applications, more panels may be used to form the tiled display device.

As shown in FIG. 1, the tiled display device 10 may include at least a first panel 12 and a second panel 14 that is tiled to one side of the first panel 12 along a tiling line AX. In other words, the first panel 12 and the second panel 14 are respectively on two sides of the tiling line AX. The tiling line AX may extend along a direction, for example, the Y direction. The first panel 12 includes an upper surface TS1 (display surface) and a lower surface BS1 that is opposite to the upper surface TS1. The upper surface TS1 of the first panel 12 includes a first display region AA1 and a second display region AA2, and the second display region AA2 is located between the first display region AA1 and the tiling line AX. The second panel 14 includes an upper surface TS2 (display surface) and a lower surface BS2 that is opposite to the upper surface TS2. The upper surface of TS2 of the second panel 14 includes a third display region AA3 and a fourth display region AA4, and the fourth display region AA4 is located between the third display region AA3 and the tiling line AX. When the first panel 12 and second panel 14 are unfolded until being substantially located in the same horizontal plane (the plane defined by the X direction and the Y direction), the first display region AA1, the second display region AA2, the third display region AA3 and the fourth display region AA4 may collectively form an expanded display region AA of the tiled display device 10. The different display regions (such as the first display region AA1, the second display region AA2, the third display region AA3 and the fourth display region AA4) of the expanded display region AA may integrally show a continuous image or may respectively show different images according to design needs, but is not limited thereto. In some embodiments, the first display region AA1 and the second display region AA2 of the first panel 12 may be used as primarily display regions, and the third display region AA3 and the fourth display region AA4 of the second panel 14 may be used as assistant display regions for the convenience of referring to two pictures simultaneously, but is not limited thereto. In some embodiments, the tiled display device of the present disclosure may be formed by tiling two or more display panels. The display regions of the panels may be in any shapes according to design needs. In some embodiments, the display regions of the panels may be non-rectangular. For example, the display regions of the panels may respectively be semicircular, and the panels are tiled to form a circular expanded display region.

In some embodiments, optionally, the first panel 12 may include a peripheral region PR1 located near at least an outer side of the first display region AA1 and an outer side the second display region AA2. Optionally, the second panel 14 may include a peripheral region PR2 located near at least an outer side of the third display region AA3 and an outer side of the fourth display region AA4. Although the portions of the peripheral region PR1 located near the upper side, the lower side and the left side of the first display region AA1 is shown in FIG. 1, it should be understood that another portion (not shown in FIG. 1) of the peripheral region PR1 of the first panel 12 may also be formed near a side of the second display region AA2 that is opposite to the first display region AA1, or a side of the second display region AA2 that is located between the second display region AA2 and the fourth display region AA4. The portion of the peripheral region PR1 located between the second display region AA2 and the fourth display region AA4 may be bent downwardly (into the drawing plane) to be lower than the display regions. In some embodiments, the portion of the peripheral region PR1 located between the second display region AA2 and the fourth display region AA4 may partially overlap the second display region AA2 and may not be observed by the user.

Similarly, although the portions of the peripheral region PR2 located near the upper side, the lower side and the left side of the third display region AA3 is shown in FIG. 1, it should be understood that another portion (not shown in FIG. 1) of the peripheral region PR2 of the second panel 14 may also be formed near a side of the fourth display region AA4 that is opposite to the third display region AA3, or a side of the fourth display region AA4 that is located between the second display region AA2 and the fourth display region AA4. The portion of the peripheral region PR2 located between the second display region AA2 and the fourth display region AA4 may be bent downwardly (into the drawing plane) to be lower than the display regions. In some embodiments, the portion of the peripheral region PR2 located between the second display region AA2 and the fourth display region AA4 may partially overlap the fourth display region AA4 and may not be observed by the user.

In some embodiments, at least a peripheral circuit device 11 may be formed in the peripheral region PR1 and/or the peripheral region PR2. The peripheral circuit device 11 may include, for example, a driving device, a reset device, a compensating device, an initializing device, an operation control device, a light-emitting control device, a capacitor, an inductor, a power supply circuit, or a combination of the above devices, but is not limited thereto. The peripheral circuit device 11 may control the display units of the first panel 12 and/or the second panel 14. In some embodiments, at least a flexible printed circuit (FPC) board (not shown) may be connected to peripheral region PR1 and/or the peripheral region PR2. The FPC board may have peripheral circuit devices formed thereon. The FPC board may bend toward the lower surface BS1 of the first panel 12 and/or the lower surface BS2 of the second panel 14. In this way, the area of the peripheral regions PR1 and/or the peripheral regions PR2 used to form the peripheral circuit devices may be reduced, and the overall area of the peripheral region PR1 and/or the peripheral region PR2 may be shrunk.

In the following description, embodiments of novel designs of the tiled display device are disclosed, which may reduce the impact of observing the dark region near the tiling line AX of the tiled display device. That is, when viewing the tiled display device 10 in a front view direction (the Z direction as shown in FIG. 1), the dark region between the second display region AA2 of the first panel 12 and the fourth display region AA4 of the second panel 14 may be less obvious. Therefore, display quality of the tiled display device provided by the present disclosure may be improved. Furthermore, embodiments which may reduce the impact of observing the dark regions caused by the peripheral region PR1 and/or the peripheral region PR2 around the first display region AA1 and the third display region AA3 as shown in FIG. 1 are also disclosed, and a 'borderless' or 'full screen' display device may be achieved. The present disclosure may reduce the problems encountered in conventional tiled display devices such as obvious dark regions, image distortions or color shifts near the splice region caused by the peripheral regions.

Figure 2:
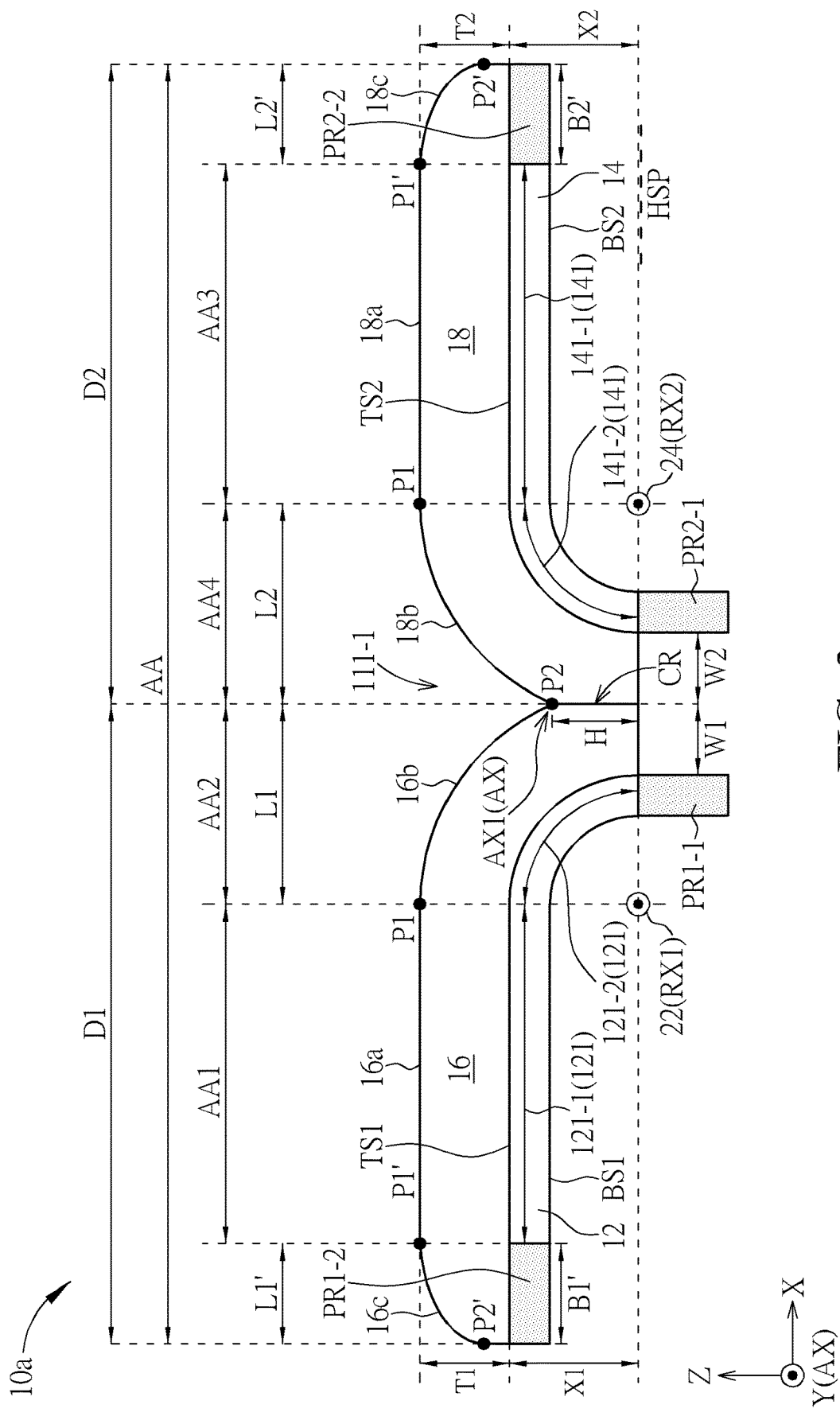
FIG. 2 is a schematic cross-sectional view of a tiled display device in an unfolded form according to an embodiment of the present disclosure.

Please refer to FIG. 2, which is a schematic cross-sectional view of a tiled display device 10a in an unfolded form according to an embodiment of the present disclosure. The tiled display device 10a includes a first panel 12 and a second panel 14 that are tiled on two sides of the tiling line AX1 along the X direction (the tiling direction). A cover layer 16 and a cover layer 18 are respectively disposed on the first panel 12 and the second panel 14. The cover layer 16 is arranged corresponding to the first panel 12, and the cover layer 18 is arranged corresponding to the second panel 14. The first panel 12 includes a light emitting region 121, a peripheral region PR1-1 and a peripheral region PR1-1. The peripheral region PR1-1 and the peripheral region PR1-1 are at two sides of the light emitting region 121. The second panel 14 includes a light emitting region 141, a peripheral region PR2-1 and a peripheral region PR2-1. The peripheral region PR2-1 and the peripheral region PR2-1 are at two sides of the light emitting region 141. The peripheral region PR1-1 of the first panel 12 and the peripheral region PR2-1 of the second panel 14 are adjacently arranged on two sides of the tiling line AX1. That is, the peripheral regions of the two panels are disposed adjacent to each other along a tiling direction (for example, the Y direction), but is not limited thereto. The upper side of FIG. 2 is the front side of the tiled display device 10a. That is, when the tiled display device 10a is in an unfolded form, the upper surface TS1 of the first panel 12 and the upper surface TS2 of the second panel 14 are facing up, and the lower surface BS1 of the first panel 12 and the lower surface BS2 of the second panel 14 are facing down. The horizontal plane HSP shown in FIG. 2 represents the plane defined by the X direction and the Y direction. In the embodiment, the position of the tiling line AX shown in FIG. 1 is approximately along the connection line of the highest point of the in the cross-sectional view shown in FIG. 2. In this embodiment, the tiling line AX and the tiling line AX1 are substantially overlapped.

The first panel 12 and second panel 14 may respectively include a multilayer structure. In an embodiment, the first panel 12 and the second panel 14 may respectively include, from the lower surface BS1 (or BS2) to the upper surface TS1 (or TS2), a supporting layer, a flexible substrate, a display device layer and a encapsulate layer, but is not limited thereto. For the sake of simplicity, those layers of the first panel 12 and second panel 14 are not shown in FIG. 2. The materials of the supporting layer may include copper (Cu), iron (Fe), aluminum (Al), or alloys of these materials, but is not limited thereto. The flexible substrate may include any suitable flexible or bendable materials, such as polyimide (PI), polyethylene naphthalate (PEN), polyethylene terephthalate ester (PET), or other polymers or a combination thereof, but is not limited thereto. The supporting layer may be attached to the flexible substrate through an adhesive layer to maintain the structure and/or shape of the flexible substrate. The display device layer is disposed on the flexible substrate and may include a dielectric stack having display units and driving devices formed therein. The dielectric stack may include organic materials, inorganic materials, or a combination thereof, but is not limited thereto. The display units may be any proper types of display units or display devices. In some embodiments, the display units may include light-emitting diodes (LEDs). For example, the light-emitting diodes may include organic light-emitting diodes (OLEDs), micro LEDs, mini LEDs, quantum dot LEDs (QLEDs), or a combination thereof, but is not limited thereto. Generally, the display units may be respectively considered as a sub-pixel. The driving devices are arranged corresponding to the display units to control the lighting of the display units. The driving devices may include, for example, top-gate TFTs or bottom-gate TFTs, but is not limited thereto. The light emitting region 121 of the first panel 12 and the light emitting region 141 of the second panel 14 are approximately the regions of the display device layers of the first panel 12 and the second panel 14, respectively. The encapsulate layer may be disposed on the display device layer. The encapsulate layer may include, for example, a thin film encapsulate (TFE) layer which has a multiple-layered structure formed by stacked organic-inorganic-organic layers. The encapsulate layer may protect the display device layer from the moisture or oxygen in the environment and improves the display quality. In some embodiments, the first panel 12 and/or the second panel 14 may have sensing functions and further include a biometric identification layer and/or a touch layer. The touch layer may have a complete touch function or an assistant touch function. In some embodiments, the touch layer may be directly disposed on the encapsulate layer. In some embodiments, the touch layer may be disposed on another flexible substrate and then be bonded to the encapsulate layer. In some embodiments, the touch layer may be integrated into the display device layer according to design needs. The biometric identification layer may have a complete biometric identification function or an assistant touch function. The biometric identification layer may be directly disposed on the encapsulate layer, or may be disposed on another flexible substrate and then bonded to the encapsulate layer. In other embodiments, according to design requirements, the biometric identification layer may be integrated into the display device layer. The biometric identification layer may be, for example, a fingerprint identification layer or other suitable identification layers.

As shown in FIG. 2, a portion of the first panel 12 near the tiling line AX1 are bent toward the lower surface BS1 of the first panel 12 in a manner of surrounding a first bending axis RX1. A portion of the second panel 14 near the tiling line AX1 is bent toward the lower surface BS2 of the second panel 14 in a manner of surrounding a second bending axis RX2. The first bending axis RX1, the second bending axis RX2 and the tiling line AX1 are extending along the Y direction. In the embodiment, the light emitting region 121 of the first panel 12 may include a primary light emitting region 121-1 and an assistant light emitting region 121-2. The assistant light emitting region 121-2 of the light emitting region 121 extends into the bending portion of the first panel 12. The light emitting region 141 of the second panel 14 may include a primary light emitting region 141-1 and an assistant light emitting region 141-2. The assistant light emitting region 141-2 of the light emitting region 141 extends into the bending portion of the second panel 14. When the tiled display device 10a is in an unfolded form, the first display region AA1 is approximately corresponding to the primary light emitting region 121-1 of the first panel 12, the second display region AA2 is approximately corresponding to the assistant light emitting region 121-2 of the first panel 12, the third display region AA3 is approximately corresponding to the primary light emitting region 141-1 of the second panel 14, and the fourth display region AA4 is approximately corresponding to the assistant light emitting region 141-2 of the second panel 14.

The first panel 12 and the second panel 14 may be tiled together by any suitable means. For example, as shown in FIG. 2, a first axis assembly 22 may be disposed near the lower surface BS1 of the first panel 12, and a second axis assembly 24 may be disposed near the lower surface BS2 of the second panel 14. A connecting element (not shown) may be provided to connect the first axis assembly 22 and the second axis assembly 24 so that the first panel 12 and the second panel 14 are tiled together in a manner of being able to relatively unfolded or folded. It should be understood that the illustrated configuration shown in FIG. 2 is only an example and is not used to limit the disclosure. In some embodiments, the position of the first axis assembly 22 may be approximately overlapped with the first bending axis RX1, and the position of the second axis assembly 24 may be approximately overlapped with the second bending axis RX2, but is not limited thereto.

The cover layer 16 and the cover layer 18 may provide protection for the first panel 12 and the second panel 14 and/or optical compensation for the display regions. The cover layer 16 and the cover layer 18 may include inorganic materials, organic materials, or a combination thereof. For example, the inorganic materials may include glass, and the organic materials may include polyimide (PI), polyethylene naphthalate (PEN), polyethylene terephthalate (PET), or other suitable polymers, but is not limited thereto.

The cover layer 16 may include a planar region 16a that is corresponding to the primary light-emitting region 121-1 of the first panel 12 and a curved region 16b that is corresponding to the assistant light-emitting region 121-2 of the first panel 12. The cover layer 18 may include a planar region 18a that is corresponding to the primary light-emitting region 141-1 of the second panel 14 and a curved region 18b that is corresponding to the assistant light-emitting region 141-2 of the second panel 14. The curved region 16b extends from a curve starting point P1 to a curve end point P2, and the curved region 18b extends from another curve starting point P1 to another curve end point P2, as shown in FIG. 2. Specifically, the curve starting point P1 is the boundary between the planar region and the curved region, and the curve end point P2 is the outer edge of the curved region. The curve starting point P1 and the curve end point P2 may be connected by any types of curve, such as a curve having a constant curvature, or a curve having gradually changed curvatures, but is not limited thereto.

When the tiled display device 10a is in the unfolded form as shown in FIG. 2, or when the primary light-emitting region 121-1 of the first panel 12 and the primary light-emitting region 141-1 of the second panel 14 are approximately located on the same horizontal plane HSP (the primary light-emitting region 121-1 and the primary light-emitting region 141-1 are aligned with the horizontal plane HSP), the curve end point P2 of the curved region 16b and the curve end point P2 of the curved region 18b may contact each other, and a recess 111-1 and a contact region CR of the cover layer 16 and the cover layer 18 may be formed. A top portion of the contact region CR may be overlapped with the curve end point P2. A bottom portion of the contact region CR and the lowest points of the assistant light emitting region 121-2 and the assistant light emitting region 141-2 may be at a same horizontal level. It should be noted that the area and position of the contact region CR may change with the structure of the tiled display device 10a or the folded/unfolded forms of the tiled display device 10a. The contact region CR may be a line or a surface. The contact region CR is substantially on an extending line of the tiling line AX1, but is not limited thereto. The top portion of the contact region CR may be lower than the upper surface TS1 of the first panel 12 and/or the upper surface TS2 of the second panel 14.

As shown in FIG. 2, the projections of the upper surface TS1 of the first panel 12 and the lowest extending point of the assistant light emitting region 121-2 (or the bottom portion of the contact region CR) on the Z direction have a distance X1. The projections of the upper surface TS2 of the second panel 14 and the lowest extending point of the assistant light emitting region 141-2 on the Z direction have a distance X2. The projections of the top portion of the contact region CR (the curve end point P2) and the lowest extending point of the assistant light emitting region 121-2 and/or the lowest extending point of the assistant light emitting region 141-2 (or the bottom portion of the contact region CR) on the Z direction have a height H. The planar region 16a of the cover layer 16 has a thickness T1 along the Z direction. The planar region 18a of the cover layer 18 has a thickness T2 along the Z direction.

When Equation 1 as shown below is satisfied, the impact of the dark regions caused by the peripheral region PR1-1 and the peripheral region PR2-1 upon the display quality may be reduced. A dark region between the second display region AA2 of the first panel 12 and the fourth display region AA4 of the second panel 14 may be less obvious for the user. In this way, the first display region AA1, the second display region AA2, the third display region AA3 and the fourth display region AA4 may collectively form an expanded display region AA.

$$0 \leq H/(Xn+Tn) < 0.8 \quad \text{(Equation 1)}$$

In Equation 1, the distance Xn and the thickness Tn represent either the group of the distance X1 of the first panel 12 and the thickness T1 of the corresponding cove layer 16 or the group of the distance X2 of the second panel 14 and the thickness T2 of the corresponding cover layer 18. The distance Xn may be adjusted according to product needs. In some embodiments, the distance Xn may be equal to or larger than 0 and equal to or smaller than 200 um. Equation 1 means that the ratio of the height H to the sum of the thickness Tn and the distance Xn is greater than or equal to 0, and is less than 0.8. In some embodiments, the distance X1 may be equal to the distance X2, and the thickness T1 may be equal to the thickness T2, but is not limited thereto.

Please continue to refer to FIG. 2. The projections of the curve starting point P1 and the curve end point P2 of the curved region 16b of the first panel 12 on the horizontal plane HSP have a distance L1. The projections of the curve starting point P1 and the curve end point P2 of the curved region 18b of the second panel 14 on the horizontal plane HSP have a distance L2. The projections of the contact region CR and the assistant light emitting region 121-2 of the first panel 12 on the horizontal plane HSP have a width W1. The projections of the contact region CR and the assistant light emitting region 141-2 of the second panel 14 on the horizontal plane HSP have a width W2. The projection of the first panel 12 on the horizontal plane HSP has a width D1. The projection of the second panel 14 on the horizontal plane HSP has a width D2. Please note that the distance L1 may also refer to the width L1 of the projection of the curved region 16b on the horizontal plane HSP, and the distance L2 may also refer to the width L2 of the projection of the curved region 18b on the horizontal plane HSP.

When Equation 2 as shown below is satisfied, the impact of the dark regions caused by the peripheral region PR1-1 and the peripheral region PR2-1 upon the display quality may be reduced. A dark region between the second display region AA2 of the first panel 12 and the fourth display region AA4 of the second panel 14 may be less obvious for the user. In this way, the first display region AA1, the second display region AA2, the third display region AA3 and the fourth display region AA4 may collectively form an expanded display region AA.

$$Dn/2 \geq Ln \geq Wn \quad \text{(Equation 2)}$$

In Equation 2, the width Dn, the distance Ln and the width Wn represent either the group of the width D1, the distance L1 and the width W1 of the first panel 12 and the corresponding cover layer 16 or the group of the width D2, the distance L2 and the width W2 of the second panel 14 and the corresponding cover layer 18. Equation 2 means that the distance Ln is less than or equal to one-half of the distance Dn and greater than or equal to the width Wn. In some embodiments, the distance L1 may be equal to the distance L2, the width D1 may be equal to the width D2, and the width W1 may be equal to the width W2, but is not limited thereto. In some embodiments, the distance L1 and the distance L2 may be different, the width D1 and the width D2 may be different, and the width W1 and the width W2 may be different. When at least one of Equation 1 and Equation 2 are satisfied, the discontinuity of the images caused by the dark region near the tiling line may be less obvious for the user, and the display quality of the tiled display device 10a may be improved.

Please continue to refer to FIG. 2. In some embodiments, the portion of the cover layer 16 corresponding to the peripheral region PR1-2 of the first panel 12 may include a curved region 16c, and the portion of the cover layer 18 corresponding to the peripheral region PR2-2 of the second panel 14 may include a curved region 18c. The curved region 16c and the curved region 18c may provide optical compensation for the peripheral region PR1-2 and the peripheral region PR2-2, respectively. The curved region 16c extends from the curve starting point P1' to the curve end point P2'. The projections of the curve starting point P1' and the curve end point P2' of the curved region 16c on the horizontal plane HSP has a distance L1'. The curved region 18c extends from another curve starting point P1' to another curve end point P2'. The projections of the curve starting point P1' and the curve end point P2' of the curved region 18c on the horizontal plane HSP has a distance L2'. A projection of the peripheral region PR1-2 on the horizontal plane HSP has a width B1'. A projection of the peripheral region PR2-2 on the horizontal plane HSP has a width B2'. When Equation 3 as shown below is satisfied, the dark regions caused by the peripheral region PR1-2 and the peripheral region PR2-2 may be reduced. In this way, the expanded display region AA may be extended to approach the outer edges of the first panel 12 and the second panel 18, and a display effect approaching "full screen" or "borderless" may be obtained.

$$Dn/2 \geq Ln' \geq Bn' \quad \text{(Equation 3)}$$

In Equation 3, the width Dn, the width Bn' and the distance Ln' represent either the group of the width D1, the width B1' and the distance L1' of the first panel 12 and the corresponding cover layer 16 or the group of the width D2, the width B2' and the distance L2' of the second panel 14 and the corresponding cover layer 18. Equation 3 means that the distance Ln' is less than or equal to one-half of the distance Dn and greater than or equal to the width Bn'. In some embodiments, the width BP may be equal to the width B2'. In other embodiments, the width BP may be different from the width B2', but is not limited thereto. Please note that the distance L1' may also refer to the width L1' of the projection of the curved region 16c on the horizontal plane HSP, and the distance L2' may also refer to the width L2' of the projection of the curved region 18c on the horizontal plane HSP.

Figure 3:
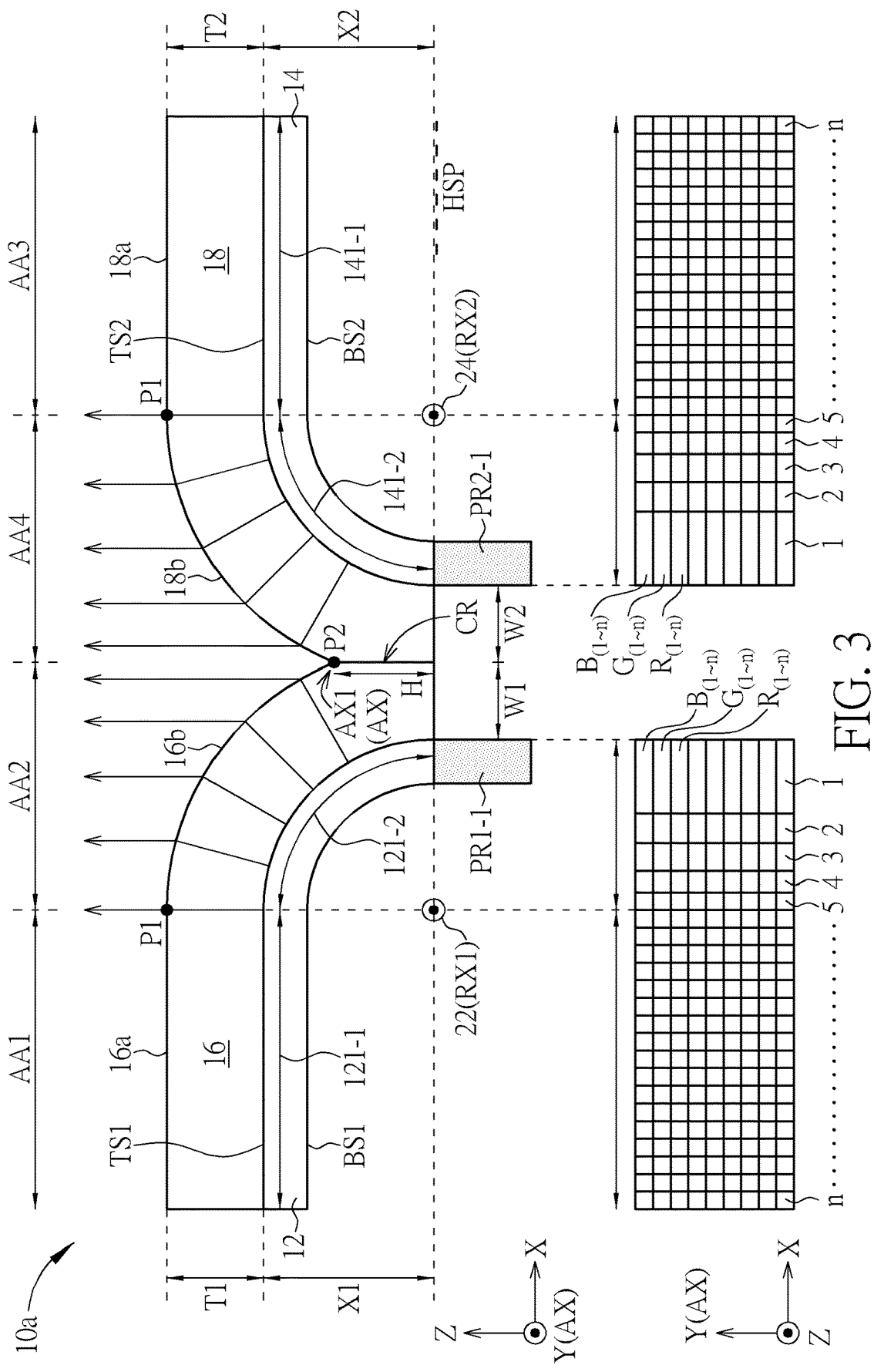
FIG. 3 is an enlarged view near the tiling line of the tiled display device of FIG. 2 in an unfolded form.

Please refer to FIG. 3. FIG. 3 is an enlarged view near the tiling line AX1 of the tiled display device 10a of FIG. 2 in an unfolded form. The upper part of FIG. 3 is a cross-sectional view, showing the lights emitted from the display device layer (not shown) of the first panel 12 and the second panel 14 and through the cover layer 16 and the cover layer 18 to display images. The lower part of FIG. 3 is a plane view, showing the pixel arrays corresponding to the primary light emitting region and the assistant light emitting region of the first panel 12 and the second panel 14. Please note that the direction axis shown in the upper part of FIG. 3 indicates the orientation of the cross-sectional view, and the direction axis shown in the lower part of FIG. 3 indicates the orientation of the plane view.

The tiled display device 10a may have a novel pixel design to reduce the rainbow patterns and/or image distortions caused by the bending portions of the first panel 12 and the second panel 14 that may be observed in the second display region AA2 and the fourth display region AA4. The sense of image discontinuity or a tiling line between the second display region AA2 and the fourth display region AA4 may be reduced.

Please refer to the lower part of FIG. 3. In some embodiments of the present disclosure, the first panel 12 and the second panel 14 may be color display panels that display multiple colors. The display device layer of the first panel 12 and the display device layer of the second panel 14 may respectively include a pixel array that includes a plurality of pixels $G_1 \sim G_n$ and pixels $B_1 \sim B_n$. For example, when the first panel 12 and the second panel 14 are RGB color panels, the pixels $R_1 \sim R_n$ may respectively display red color, the pixels $G_1 \sim G_n$ may display green color, and the pixels $B_1 \sim B_n$ may display blue color, but is not limited thereto. One feature of the present disclosure is that, the pixels of the same color are arranged in rows along the X direction (the first direction), and rows of different colors are alternately arranged along the Y direction (the second direction). According to some embodiments, the X direction (the first direction) and the Y direction (the second direction) are perpendicular. In this way, the lights of different colors from the same column of pixels (the pixels arranged along the Y direction) in the assistant light emitting region may be refracted at a same angle by the curved region of the cover layer. Consequently, when viewing the tiled display device 10a from a front view direction, the lights of different colors from the same column of pixels (arranged along the Y direction) may be stretched at equal magnification, thus reducing the rainbow patterns. It should be understood that the arrangements of the pixels shown in FIG. 3 are examples and should not intent to limit the scope of the present disclosure. The pixels may be arranged in other ways. For example, pixels $R_1 \sim R_n$, pixels $G_1 \sim G_n$, and pixels $B_1 \sim B_n$ may be arranged in a staggered manner and not being aligned.

Please still refer to the lower part of FIG. 3. Furthermore, in some embodiments of the present disclosure, the widths of the pixels in the assistant light emitting region may be adjusted along the X direction (the first direction) according to the curvature of the assistant light emitting region of the panel and/or the curvature of the curved region of the cover layer. As shown in the lower part of FIG. 3, the pixels of the same color in the same row (arranged along the X direction) in the assistant light emitting region 121-2 of the first panel 12 may have different widths and/or lengths. For example, the widths and/or lengths of the pixels $R_1$ to $R_5$ in the assistant light emitting region 121-2 of the first panel 12 may be gradually decreased to compensate image stretching of the pixels $R_1$ to $R_5$ caused by being refracted by the curved region 16b of the cover layer 16. Therefore, the display quality may be improved. Similarly, the pixels of the same color in the same row (arranged along the X direction) in the assistant light emitting region 141-2 of the second panel 14 may have different widths and/or lengths. The widths and/or lengths of the pixels $R_1$ to $R_5$ in the assistant light emitting region 141-2 of the second panel 14 may be gradually decreased. It should be understood that the numbers and dimensions of the pixels shown in FIG. 3 are examples and should not intent to limit the scope of the present disclosure. The design of pixels should depend on product requirements. Moreover, the first panel 12 and the second panel 14 are not limited to RGB color panels. In other embodiments, the first panel 12 and the second panel 14 may include pixels displaying other colors. It should be noted that the widths of the pixels are measured along a direction approximately perpendicular to the bending axis of the panels, and the lengths of the pixels are measured along a direction approximately parallel to the bending axis of the panels.

In some embodiments, the pixels corresponding to the curved region 16c of the cover layer 16 and the curved region 18c of the cover layer 18 may be designed in the same way as illustrated above to improve the display quality near the curved region 16c and the curved region 18c. Details are not repeated herein for the sake of simplicity.

Figure 4:
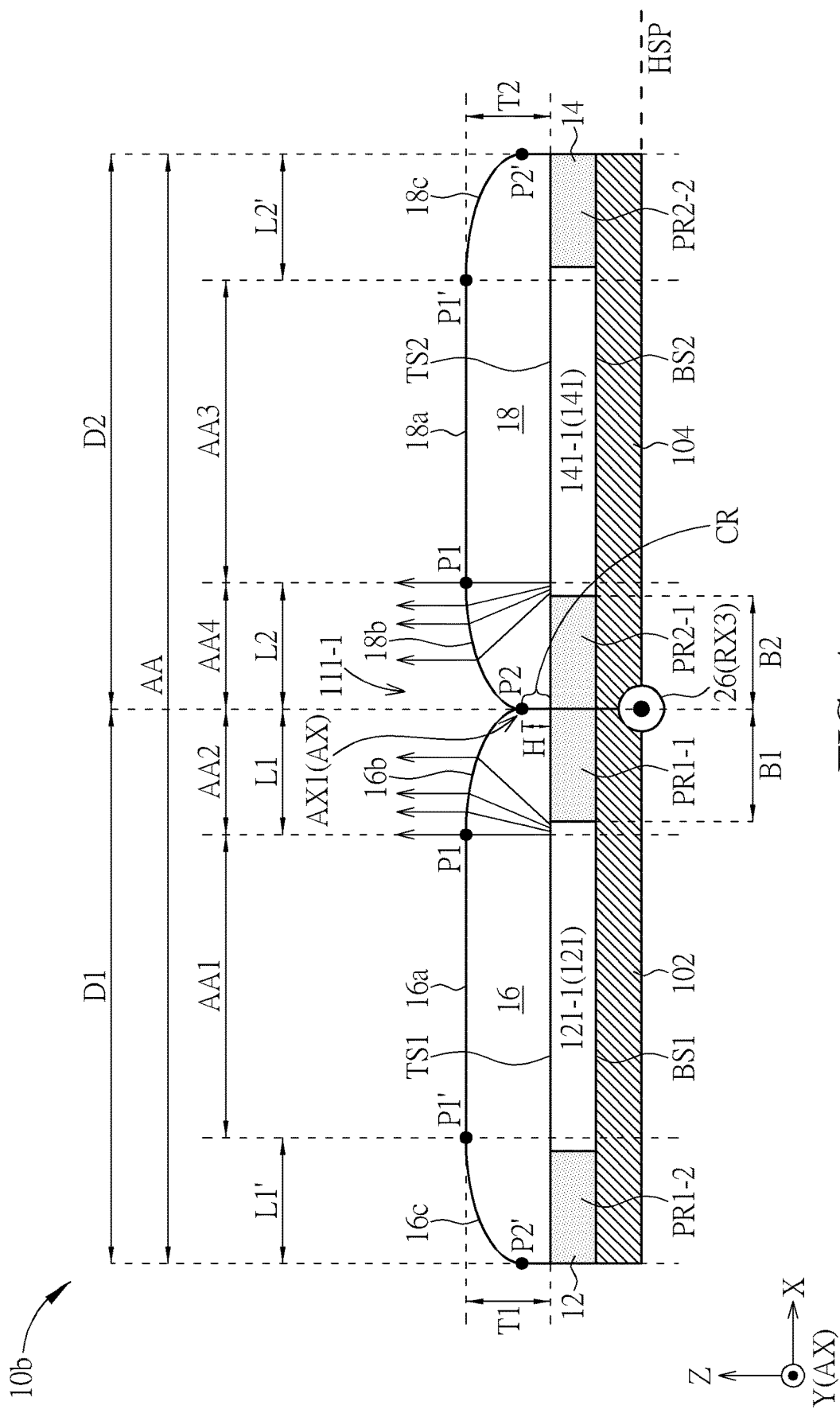
FIG. 4 is a schematic cross-sectional view of a tiled display device in an unfolded form according to another embodiment of the present disclosure.

Please refer to FIG. 4, which is a schematic cross-sectional view of a tiled display device 10b in an unfolded form according to an embodiment of the present disclosure. The difference between the tiled display device 10b shown in FIG. 4 and the tiled display device 10a shown in FIG. 2 and FIG. 3 is that, both of the first panel 12 and the second panel 14 are planar display panels. The light emitting regions of the first panel 12 and the second panel 14 are not bent. The entire of the light emitting region 121 of the first panel 12 is the primary light emitting region 121-1. The entire light emitting region 141 of the second panel 14 is the primary light emitting region 141-1. The peripheral region PR1-1 of the first panel 12 and the peripheral region PR2-1 of the second panel 14 are adjacently disposed on two sides of the tiling line AX1. The primary light emitting region 121-1 and the primary light emitting region 141-1 are located on the same horizontal plane when the tiled display device 10b in an unfolded form.

The first panel 12 and second panel 14 may be tiled together by any suitable means. For example, as shown in FIG. 4, a first support layer 102 may be provided on the lower surface BS1 of the first panel 12, and a second support layer 104 may be provided on the lower surface BS2 of the second panel 14. A connecting element (not shown) may be provided to connect the first panel 12 and the second panel 14 to a common axis assembly 26 so that the first panel 12 and the second panel 14 of the tiled display device 10b are able to relatively rotate around the rotating axis RX3 to change between the unfolded form and the folded form. It should be understood that the illustrated configuration shown in FIG. 4 is only an example and is not used to limit the disclosure.

The cover layer 16 may include a planar region 16a corresponding to the primary light-emitting region 121-1 of the first panel 12 and a curved region 16b corresponding to the peripheral region PR1-1 of the first panel 12. The curved region 16b extends from the curve starting point P1 to the curve end point P2. Similarly, the cover layer 18 may include a planar region 18a corresponding to the primary light-emitting region 141-1 of the second panel 14 and a curved region 18b corresponding to the peripheral region PR2-1 of the second panel 14. The curved region 18b extends from the curve starting point P1 to the curve end point P2. The curve starting point P1 and the curve end point P2 may be connected by any types of curve, such as a curve having a constant curvature, or a curve having gradually changed curvatures, but is not limited thereto. When the tiled display device 10b is in an unfolded form, that is, when the primary light-emitting region 121-1 and the primary light-emitting region 141-1 are approximately located on the same horizontal plane HSP (the primary light-emitting region 121-1 and the primary light-emitting region 141-1 are aligned with the horizontal plane HSP), the curve end point P2 of the curved region 16b and the curve end point P2 of the curved region 18b contact each other, and a recess 111-1 and a contact region CR of the cover layer 16 and the cover layer 18 may be formed. A top portion of the contact region CR is substantially overlapped with the curve end point P2. A bottom portion of the contact region CR and the top surface TS1 of the first panel 12 and/or the top surface TS2 of the second panel 14 are at a same horizontal level. It should be noted that the area and position of the contact region CR may change with the structure of the tiled display device 10b or the folded/unfolded forms of the tiled display device 10b. The contact region CR may be a line or a surface. The contact region CR is substantially on an extending line of the tiling line AX1, but is not limited thereto.

Please continue to refer to FIG. 4. The projections of the upper surface TS1 of the first panel 12 and the bottom portion of the contact region CR on the Z direction have a distance X1. The projections of the upper surface TS2 of the second panel 14 and the bottom portion of the contact region CR on the Z direction have a distance X2. The projections of the top portion of the contact region CR (the curve end point P2) and the top surface TS1 of the first panel 12 and/or the top surface TS2 of the second panel 14 (or the projections of the top portion of the contact region CR and the bottom portion of the contact region CR) on the Z direction have a height H. The planar region 16a of the cover layer 16 has a thickness T1 along the Z direction. The planar region 18a of the cover layer 18 has a thickness T2 along the Z direction.

When Equation 1 as shown below is satisfied, the impact of the dark regions caused by the peripheral region PR1-1 and the peripheral region PR2-1 upon the display quality may be reduced. A dark region between the second display region AA2 of the first panel 12 and the fourth display region AA4 of the second panel 14 may be less obvious for the user. In this way, the first display region AA1, the second display region AA2, the third display region AA3 and the fourth display region AA4 may collectively form an expanded display region AA.

$$0 \leq H/(Hn+Tn) < 0.8 \quad \text{(Equation 1)}$$

In Equation 1, the distance Xn and the thickness Tn represent either the group of the distance X1 of the first panel 12 and the thickness T1 of the corresponding cove layer 16 or the group of the distance X2 of the second panel 14 and the thickness T2 of the corresponding cover layer 18. The distance Xn may be adjusted according to product needs. In some embodiments, the distance Xn may be equal to or larger than 0 and equal to or smaller than 200 um. In the embodiment shown in FIG. 4, the distance Xn is substantially 0. Equation 1 means that the ratio of the height H to the sum of the thickness Tn and the distance Xn is greater than or equal to 0, and is less than 0.8. In some embodiments, the distance X1 may be equal to the distance X2, and the thickness T1 may be equal to the thickness T2, but is not limited thereto.

Please continue to refer to FIG. 4. The projections of the curve starting point P1 and the curve end point P2 of the curved region 16b of the first panel 12 on the horizontal plane HSP have a distance L1. The projections of the curve starting point P1 and the curve end point P2 of the curved region 18b of the second panel 14 on the horizontal plane HSP have a distance L2. The projection of the peripheral region PR1-1 of the first panel 12 on the horizontal plane HSP has a width B1. The projection of the peripheral region PR2-1 of the second panel 14 on the horizontal plane HSP has a width B2. The projection of the first panel 12 on the horizontal plane HSP has a width D1. The projection of the second panel 14 on the horizontal plane HSP has a width D2. When Equation 4 as shown below is satisfied, the influence of the dark regions caused by the peripheral region PR1-1 and the peripheral region PR2-1 upon the display quality may be reduced. A dark region between the second display region AA2 of the first panel 12 and the fourth display region AA4 of the second panel 14 being observed by the user may be reduced. In this way, the first display region AA1, the second display region AA2, the third display region AA3 and the fourth display region AA4 may collectively form an expanded display region AA.

$$Dn/2 \geq Ln \geq Bn \quad \text{(Equation 4)}$$

In Equation 4, the width Dn, the distance Ln and the width Bn represent either the group of the width D1, the distance L1 and the width B1 of the first panel 12 and the corresponding cover layer 16 or the group of the width D2, the distance L2 and the width B2 of the second panel 14 and the corresponding cover layer 18. Equation 4 means that the distance Ln is less than or equal to one-half of the distance Dn and greater than or equal to the width Bn. In some embodiments, the distance L1 may be equal to the distance L2, the width D1 may be equal to the width D2, and the width B1 may be equal to the width B2, but is not limited thereto. In some embodiments, the distance L1 may be different from the distance L2, the width D1 may be different from the width D2, and the width B1 may be different from the width B2. When at least one of Equation 1 and Equation 4 are satisfied, the discontinuity of the images caused by the dark region near the tiling line may be less obvious for the user, and the display quality of the tiled display device 10b may be improved.

Please continue to refer to FIG. 4. In some embodiments, the portion of the cover layer 16 corresponding to the peripheral region PR1-2 of the first panel 12 may include a curved region 16c, and the portion of the cover layer 18 corresponding to the peripheral region PR2-2 of the second panel 14 may include a curved region 18c. The curved region 16c and the curved region 18c may provide optical compensation for the peripheral region PR1-2 and the peripheral region PR2-2, respectively. The curved region 16c extends from the curve starting point P1' to the curve end point P2'. The projections of the curve starting point P1' and the curve end point P2' of the curved region 16c on the horizontal plane HSP has a distance L1'. The curved region 18c extends from another curve starting point P1' to another curve end point P2'. The projections of the curve starting point P1' and the curve end point P2' of the curved region 18c on the horizontal plane HSP has a distance L2'. A projection of the peripheral region PR1-2 on the horizontal plane HSP has a width B1'. A projection of the peripheral region PR2-2 on the horizontal plane HSP has a width B2'. When Equation 3 as shown below is satisfied, the dark regions caused by the peripheral region PR1-2 and the peripheral region PR2-2 may be reduced. In this way, the expanded display region AA may be extended to approach the outer edges of the first panel 12 and the second panel 18, and a display effect approaching "full screen" or "borderless" may be obtained.

$$Dn/2 \geq Ln' \geq Bn' \quad \text{(Equation 3)}$$

In Equation 3, the width Dn, the width Bn' and the distance Ln' represent either the group of the width D1, the width B1' and the distance L1' of the first panel 12 and the corresponding cover layer 16 or the group of the width D2, the width B2' and the distance L2' of the second panel 14 and the corresponding cover layer 18. Equation 3 means that the distance Ln' is less than or equal to one-half of the distance Dn and greater than or equal to the width Bn'. In some embodiments, the width BP may be equal to the width B2'. In other embodiments, the width BP may be different from the width B2', but is not limited thereto.

Figure 5:
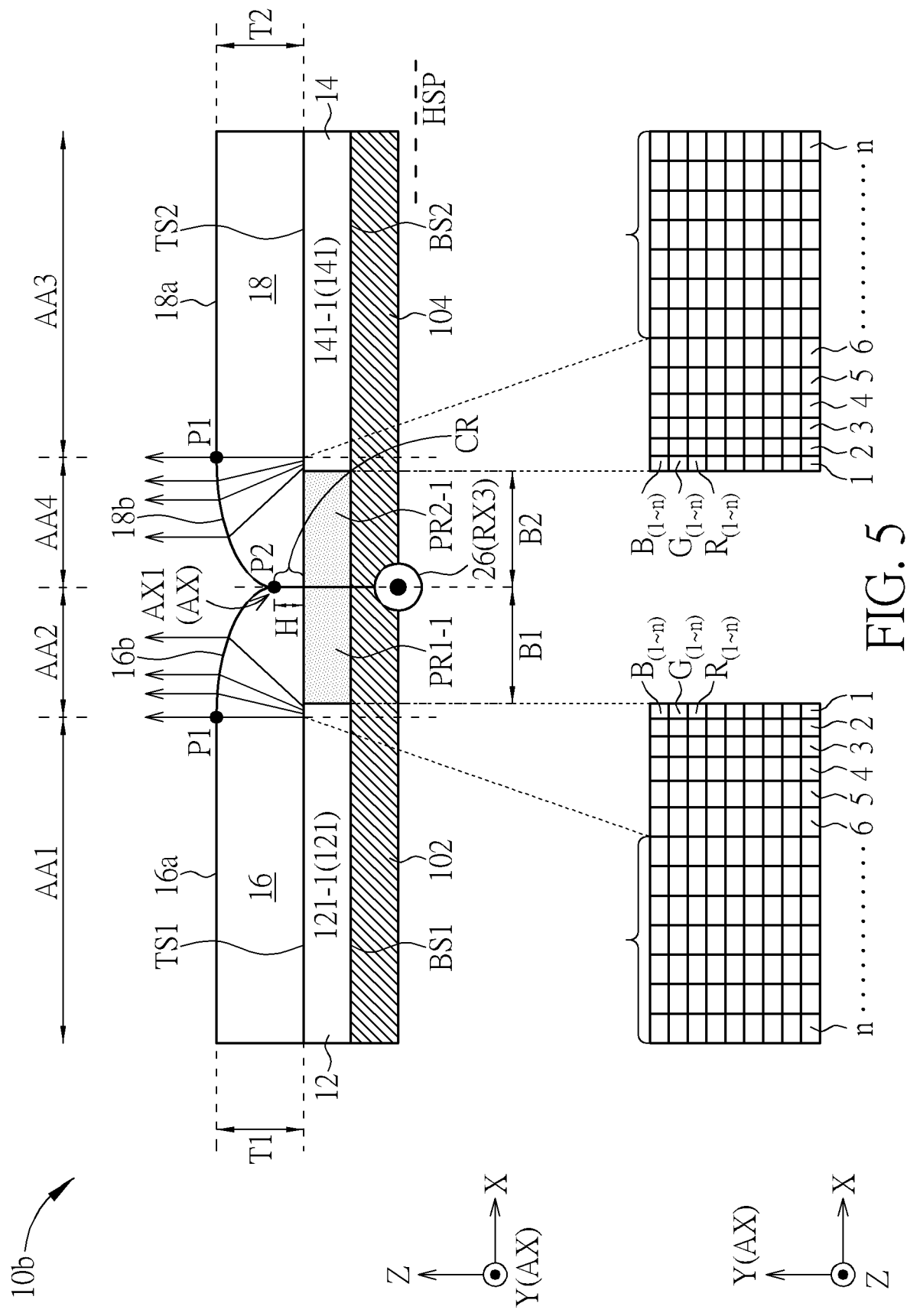
FIG. 5 is an enlarged view near the tiling line of the tiled display device of FIG. 4 in an unfolded form.

Please refer to FIG. 5. FIG. 5 is an enlarged view near the tiling line AX1 of the tiled display device 10b of FIG. 4 in an unfolded form. The upper part of FIG. 5 is a cross-sectional view, showing the lights emitted from the display device layer (not shown) of the first panel 12 and the second panel 14 and through the cover layer 16 and the cover layer 18 to display images. The lower part of FIG. 5 is a plane view, showing the pixel arrays of the primary light emitting region of the first panel 12 and the second panel 14. Please note that the direction axis shown in the upper part of FIG. 5 indicates the orientation of the cross-sectional view, and the direction axis shown in the lower part of FIG. 5 indicates the orientation of the plane view.

The tiled display device 10b may have a novel pixel design to reduce the rainbow patterns and/or image distortions caused by the bending portions of the first panel 12 and the second panel 14 that may be observed in the second display region AA2 and the fourth display region AA4. The sense of image discontinuity or a tiling line between the second display region AA2 and the fourth display region AA4 may be reduced.

Please refer to the lower part of FIG. 5, which shows the pixel arrays near the peripheral region PR1-1 of the first panel 12 and the peripheral region PR2-1 of the second panel 14. The pixels $R_1$~$R_n$ may display red color, the pixels $G_1$~$G_n$ may display green color, and the pixels $B_1$~$B_n$ may display blue color, but is not limited thereto. It is noteworthy that the pixels of the same color are arranged in rows along the X direction (the first direction), and rows of different colors are alternately arranged along the Y direction (the second direction). In this way, the lights of different colors from the same column of pixels (the pixels arranged along the Y direction) in the primary light emitting region near the peripheral region may be refracted at a same angle by the curved region of the cover layer. Consequently, when viewing the tiled display device 10b from a front view direction, pixels of different color in the same column (arranged along the Y direction) near the peripheral region may be stretched at equal magnification, thus reducing the rainbow patterns. It should be understood that the arrangements of the pixels described in the embodiment shown in FIG. 5 are examples and should not intent to limit the scope of the present disclosure. The pixels may be arranged in other ways. For example, pixels $R_1$~$R_n$, pixels $G_1$~$G_n$, and pixels $B_1$~$B_n$ may be arranged in a staggered manner and not being aligned.

Please still refer to FIG. 5. Furthermore, in some embodiments of the present disclosure, the widths of the pixels near the peripheral region may be adjusted along the X direction according to the curvature of the curved region 16b of the cover layer 16 and the curvature of the curved region 18b of the cover layer 18 to compensate the image stretching, thereby reducing image distortions. Please refer to the lower part of FIG. 5. The pixels (for example, the pixels $R_1$ to $R_5$) of the same color in the same row (arranged along the X direction) of the first panel 12 and the second panel 14 may have different widths and/or lengths. For example, the widths and/or lengths of the pixels $R_1$ to $R_5$ of the first panel 12 and the second panel 14 may be gradually increased. It should be understood that the numbers and dimensions of the pixels (such as pixels $R_1$ to $R_5$) described in the embodiment shown in FIG. 5 are example and should not intent to limit the scope of the present disclosure. The design of pixels should depend on product requirements. The widths of the pixels are measured along a direction approximately perpendicular to the bending axis of the panels, and the lengths of the pixels are measured along a direction approximately parallel to the bending axis of the panels.

Figure 6:
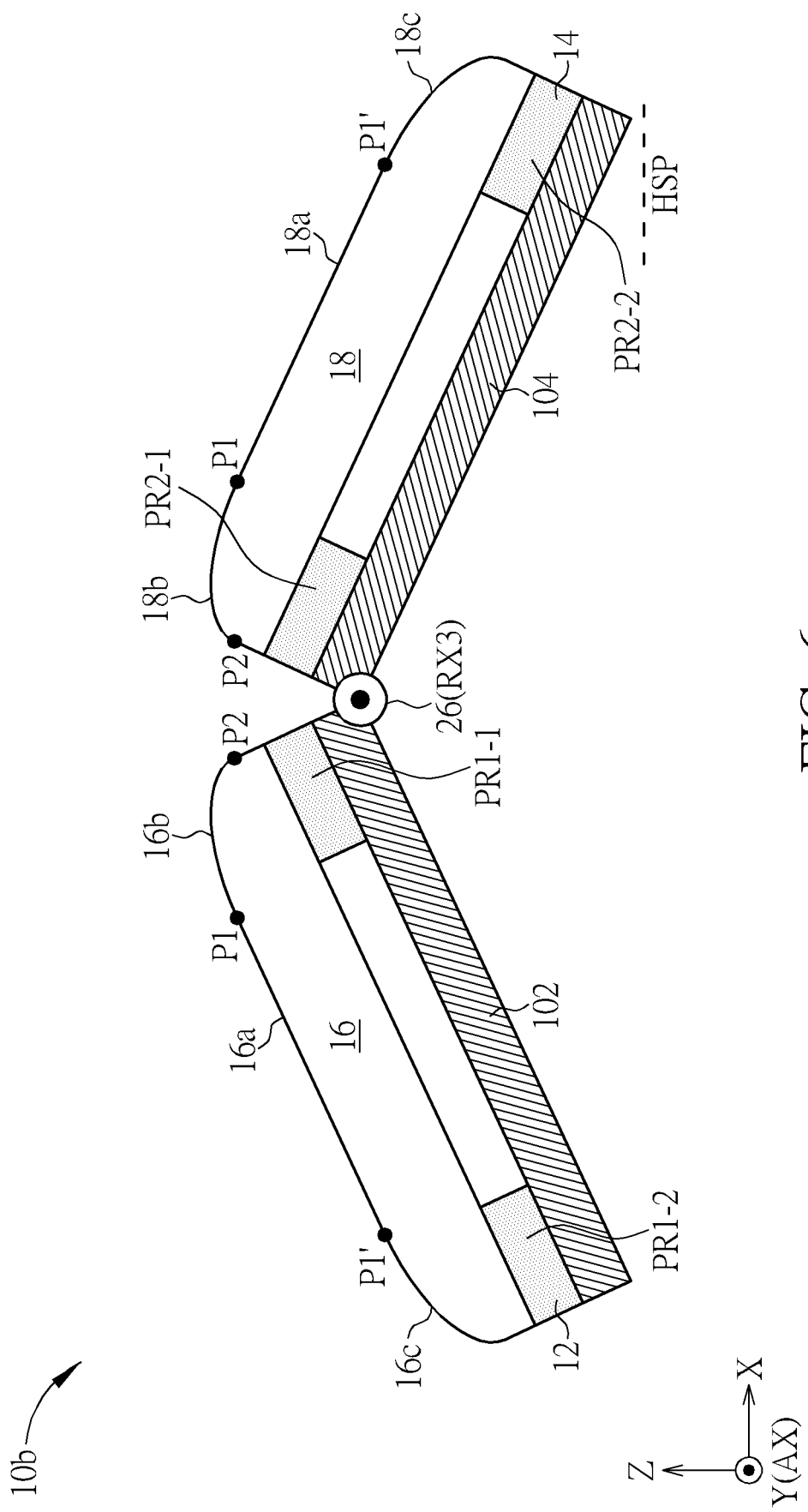
FIG. 6 is a schematic cross-sectional view showing the tiled display device of FIG. 4 in a partially folded form.

Please refer to FIG. 6, which is a schematic cross-sectional view showing the tiled display device 10b of FIG. 4 in a partially folded form that the lower surface BS1 of the first panel 12 is bent toward the lower surface BS2 of the second panel 14. In a conventional foldable tiled display device, the devices or film layers (such as electrode layers, active layers of TFTs and the signal lines) in the bending region may be damaged by the stress generated by folding or bending the display device, and consequently the light emitting quality and performances of the TFTs of the conventional foldable tiled display device are decreased. Advantageously, the tiled display device 10b shown in FIG. 6 may change between the unfolded form and the folded form by relatively rotating the first panel 12 and the second panel 14 around the rotating axis RX3. In this way, the tiled display device 10b may have increased stability and reliability. In some embodiments, the dimensions of the first panel 12 and the second panel 14 may be different. In some embodiments, a connecting element (not shown) may be provided to facilitate folding the upper surface TS1 of the first panel 12 toward the upper surface TS2 of the second panel 14.

Figure 7:
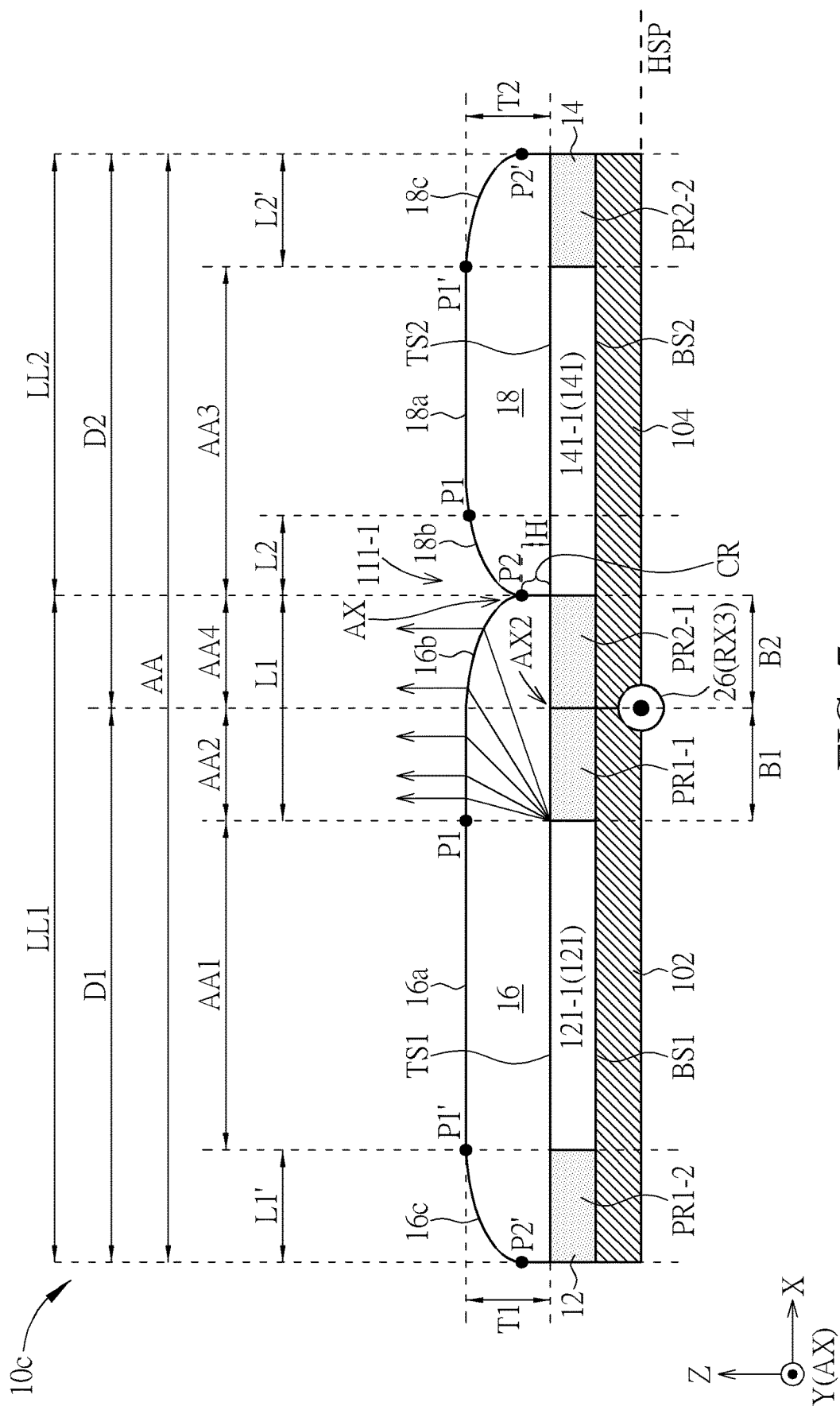
FIG. 7 is a schematic cross-sectional view of a tiled display device in an unfolded form according to another embodiment of the present disclosure.

Please refer to FIG. 7, is a schematic cross-sectional view of a tiled display device 10c in an unfolded form according to another embodiment of the present disclosure. The tiled display device 10c includes a first panel 12 and a second panel 14 tiled on two sides of the tiling line AX2. A cover layer 16 is disposed on the first panel 12. A cover layer 18 is on the second panel 14. More specifically speaking, most of the cover layer 16 is provided corresponding to the first panel 12, and the cover layer 18 is provided corresponding to the second panel 14. In the embodiment, the position of the tiling line AX shown in FIG. 1 is approximately along the connection line of the highest point of the in the cross-sectional view shown in FIG. 7. In this embodiment, the tiling line AX and the tiling line AX2 are not aligned along the Z direction. The difference between the tiled display device 10c shown in FIG. 7 and the tiled display device 10b shown in FIG. 4 and FIG. 6 is that, the curved region 16b of the cover layer 16 is extended toward the second panel 14 and is disposed on at least a part of the peripheral region PR2-1 of the second panel 14. In this way, the curved region 16b of the cover layer 16 may simultaneously provide optical compensations to the peripheral region PR1-2 of the first panel 12 and the peripheral region PR2-2 of the second panel 14.

As shown in FIG. 7, the cover layer 16 is formed on the first panel 12, and includes a planar region 16a corresponding to the primary light emitting region 121-1 of the first panel 12 and a curved region 16b corresponding to the peripheral region PR1-1 of the first panel 12 and the peripheral region PR2-1 of the second panel 14. The curved region 16b extends from the curve starting point P1 to the curve end point P2. The cover layer 18 is formed on the second panel 14, and includes a planar region 18a and a curved region 18b that extends from another curve starting point P1 to another curve end point P2. Both of the planar region 18a and the curved region 18b of the cover layer 18 are corresponding to the primary light emitting region 141-1 of the second panel 14. The curve starting point P1 and the curve end point P2 may be connected by any types of curve, such as a curve having a constant curvature, or a curve having gradually changed curvatures, but is not limited thereto.

When the tiled display device 10c is in an unfolded form as shown in FIG. 7, or when the primary light-emitting region 121-1 of the first panel 12 and the primary light-emitting region 141-1 of the second panel 14 are approximately located on the same horizontal plane HSP (the primary light-emitting region 121-1 and the primary light-emitting region 141-1 are aligned with the horizontal plane HSP), the curve end point P2 of the curved region 16b and the curve end point P2 of the curved region 18b may contact each other, and a recess 111-1 and a contact region CR of the cover layer 16 and the cover layer 18 may be formed. A top portion of the contact region CR may be overlapped with the curve end point P2. A bottom portion of the contact region CR the top surface TS1 of the first panel 12 and the top surface TS2 of the second panel 14 in the embodiment) are at a same horizontal level. The area and position of the contact region CR may change with the structure of the tiled display device 10c or the folded/unfolded forms of the tiled display device 10c. The contact region CR may be a line or a surface. The contact region CR is substantially parallel to extending line of the tiling line AX2 (parallel to the Y direction), but is not limited thereto. As shown in FIG. 7, when the tiled display device 10c is in an unfolded form, a projection of the cover layer 16 on the horizontal plane HSP has a length LL1, and a projection of the cover layer 18 on the horizontal plane HSP has a length LL2. In some embodiments, the length LL1 of the cover layer 16 is larger than the length LL2 of the cover layer 18.

Please continue to refer to FIG. 7. The projections of the upper surface TS1 of the first panel 12 and the lowest point, that is, the lower surface BS1 of the first panel 12 on the Z direction have a distance X1. The projections of the upper surface TS2 of the second panel 14 and the lowest point, that is, the lower surface BS2 of the second panel 14 on the Z direction have a distance X2. The projections of the top portion of the contact region CR (the curve end point P2) and the lower surface BS1 of the first panel 12 and/or the lower surface BS2 of the second panel 14 on the Z direction have a height H. The projections of the curve starting point P1 and the curve end point P2 of the curved region 16b of the first panel 12 on the horizontal plane HSP have a distance L1. The projections of the curve starting point P1 and the curve end point P2 of the curved region 18b of the second panel 14 on the horizontal plane HSP have a distance L2. A projection of the peripheral region PR1-2 on the horizontal plane HSP has a width B1. A projection of the peripheral region PR2-2 on the horizontal plane HSP has a width B2. The planar region 16a of the cover layer 16 has a thickness T1 along the Z direction. The planar region 18a of the cover layer 18 has a thickness T2 along the Z direction. The projection of the first panel 12 on the horizontal plane HSP has a width D1. The projection of the second panel 14 on the horizontal plane HSP has a width D2. When Equation 5 as shown below is satisfied, the impact of the dark regions caused by the peripheral region PR1-1 and the peripheral region PR2-1 upon the display quality may be reduced. A dark region between the second display region AA2 of the first panel 12 and the fourth display region AA4 of the second panel 14 may be less obvious for the user. In this way, the first display region AA1, the second display region AA2, the third display region AA3 and the fourth display region AA4 may collectively form an expanded display region AA.

$$(1/2)D1 \geq L1 \geq B1+B2 \qquad \text{(Equation 5)}$$

Equation 5 means that the distance L1 is less than or equal to one-half of the distance D1 and greater than or equal to a sum of the width B1 and the width B2. In some embodiments, the width D1 may be equal to the width D2, and the width B1 may be equal to the width B2. In other embodiments, the width D1 may be different from the width D2, and the width B1 may be different from the width B2, but is not limited thereto.

Figure 8:
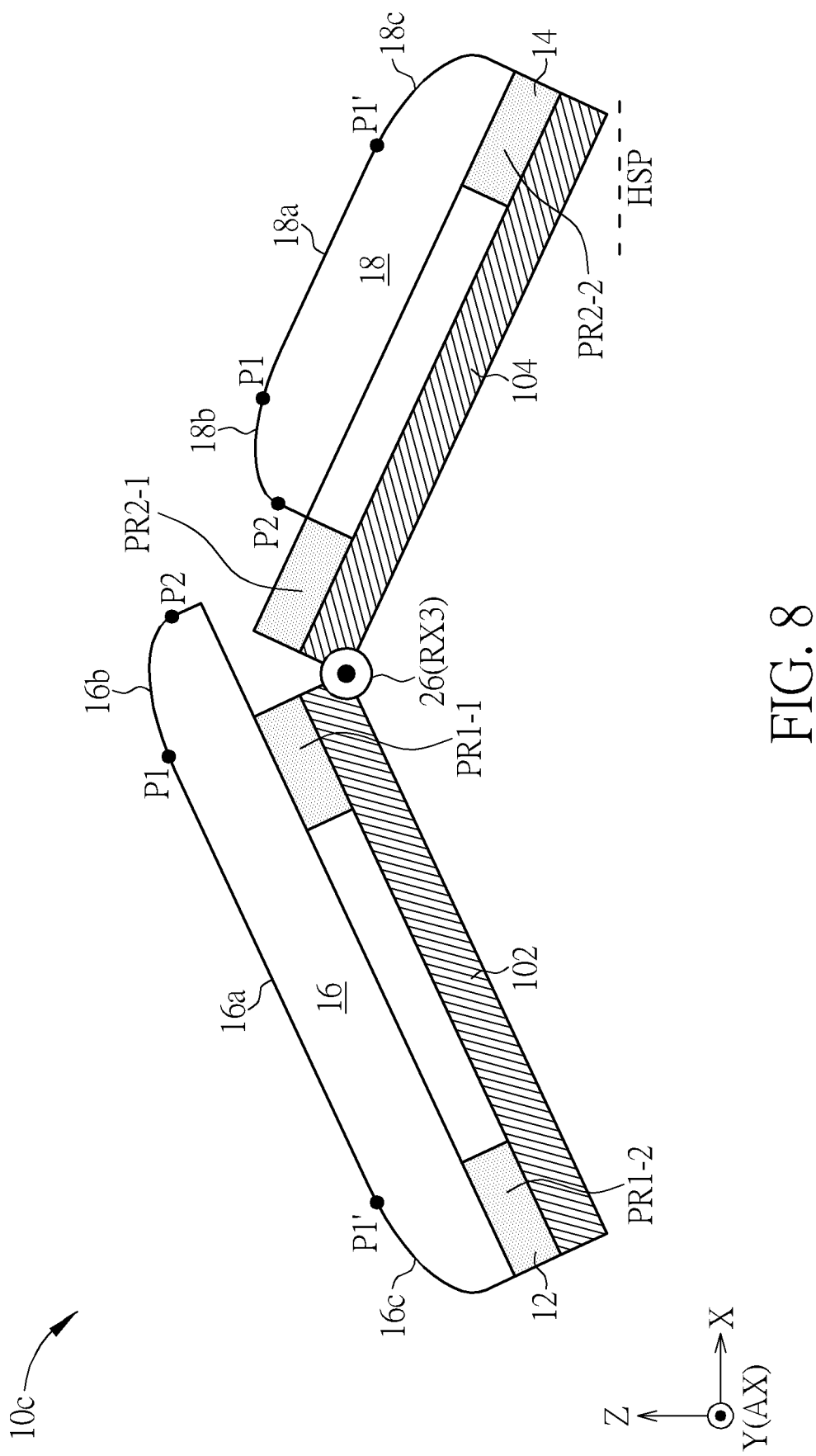
FIG. 8 is a schematic cross-sectional view showing the tiled display device of FIG. 7 in a partially folded form.

Please refer to FIG. 8, which is a schematic cross-sectional view showing the tiled display device 10c of FIG. 7 in a partially folded form that the lower surface BS1 of the first panel 12 is bent toward the lower surface BS2 of the second panel 14. As shown in FIG. 8, the peripheral region PR2-1 of the second panel 14 is exposed from the curved region 16b of the cover layer 16 when the tiled display device 10c is folded.

Figure 9:
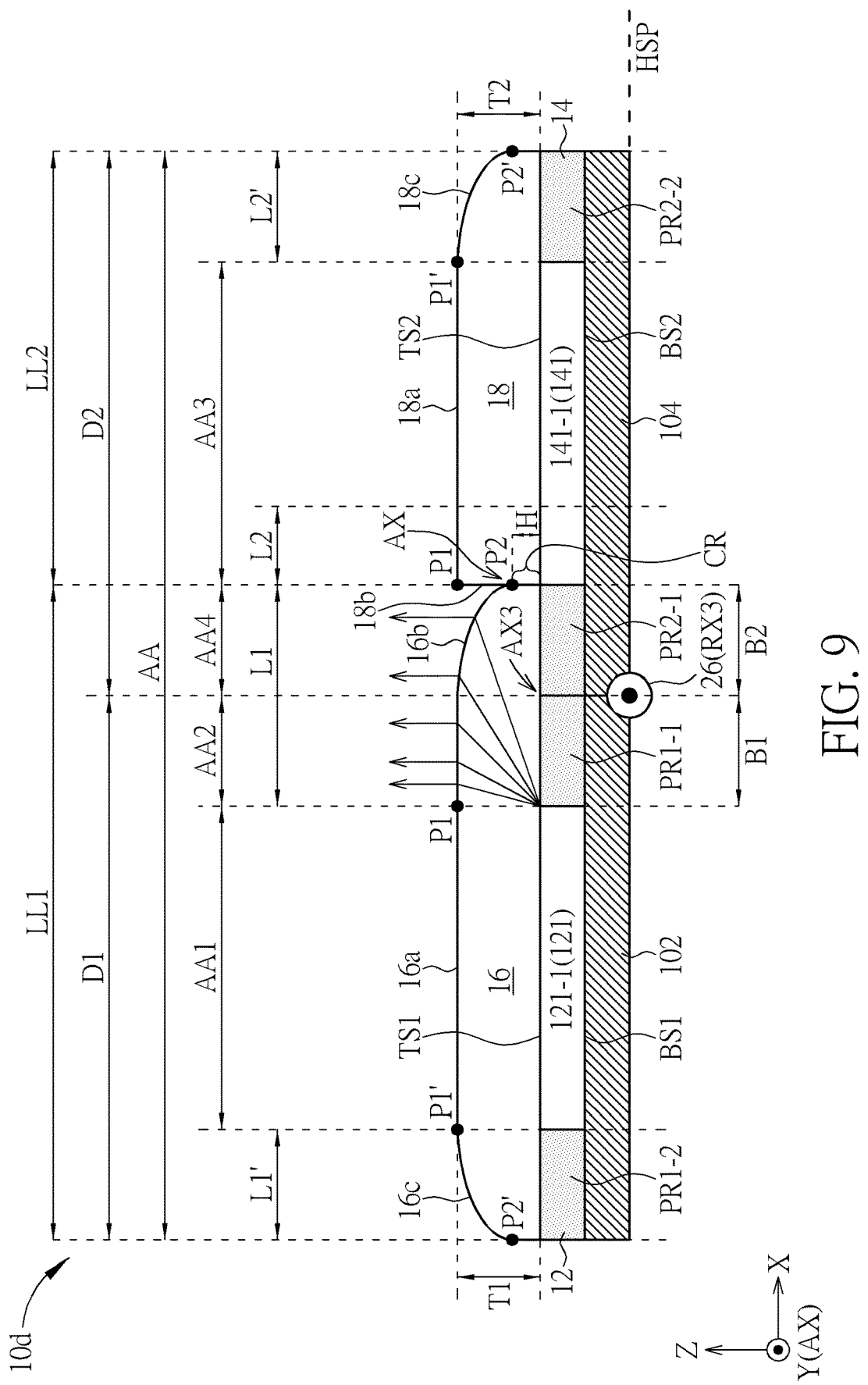
FIG. 9 is a schematic cross-sectional view of a tiled display device in an unfolded form according to another embodiment of the present disclosure.

Please refer to FIG. 9, which shows a schematic cross-sectional view of a tiled display device 10d in an unfolded form according to another embodiment of the present disclosure. The tiled display device 10d includes a first panel 12 and a second panel 14 tiled on two sides of the tiling line AX3. A cover layer 16 is disposed on the first panel 12. A cover layer 18 is on the second panel 14. More specifically speaking, most of the cover layer 16 is provided corresponding to the first panel 12, and the cover layer 18 is provided corresponding to the second panel 14. In the embodiment, the position of the tiling line AX shown in FIG. 1 is approximately along the connection line of the highest point of the in the cross-sectional view shown in FIG. 9. In this embodiment, the tiling line AX and the tiling line AX3 are not aligned along the Z direction. The difference between the tiled display device 10d shown in FIG. 9 and the tiled display device 10c shown in FIG. 7 is that, the length L2 of the projection of the curved region 18b of the cover layer 18 on the horizontal plane HSP is approximately 0. That is, the curve start point P1 of the curved region 18b is substantially directly above the curve end point P2 of the curved region 18b. In the embodiment, the curved region 16b of the cover layer 16 is extended toward the second panel 14 and is disposed on at least a part of the peripheral region PR2-1 of the second panel 14. In this way, the curved region 16b of the cover layer 16 may simultaneously provide optical compensations to the peripheral region PR1-2 of the first panel 12 and the peripheral region PR2-2 of the second panel 14. A dark region between the second display region AA2 of the first panel 12 and the fourth display region AA4 of the second panel 14 may be less obvious for the user.

Figure 10:
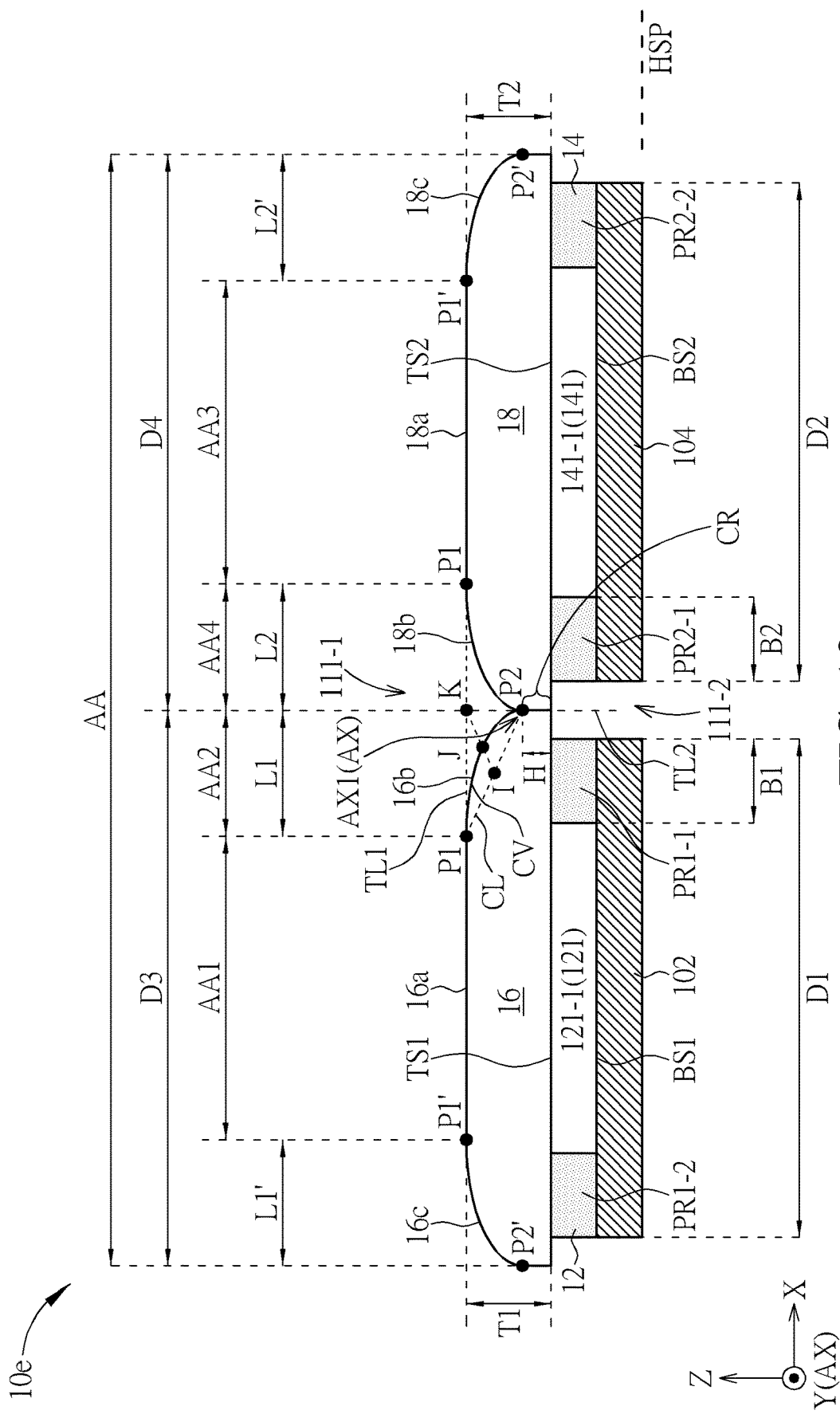
FIG. 10 is a schematic cross-sectional view of a tiled display device in an unfolded form according to another embodiment of the present disclosure.

Please refer to FIG. 10, which is a schematic cross-sectional view of a tiled display device 10e in an unfolded form according to an embodiment of the present disclosure. Similar to the tiled display device 10b shown in FIG. 4, the tiled display device 10e includes a first panel 12 and a second panel 14 that are substantially planar panels, and a cover layer 16 and a cover layer 18 that are respectively disposed on the first panel 12 and the second panel 14. The cover layer 16 and the cover layer 18 have a contact region CR therebetween.

A difference between FIG. 4 and FIG. 10 is that, in the tiled display device 10e shown in FIG. 10, the width D3 of the projection of the cover layer 16 on the horizontal plane HSP is larger than the width D1 of the projection of the first panel 12 on the horizontal plane HSP, and the width D4 of the projection of the cover layer 18 of the tiled display device 10e on the horizontal plane HSP is larger than the width D2 of the projection of the second panel 14 on the horizontal plane HSP. Accordingly, the cover layer 16 of the tiled display device 10e protrudes from the edge of the first panel 12, and the second cover layer 18 protrudes from the edge of the second panel 14.

In detail, a difference between FIG. 4 and FIG. 10 is that, in the tiled display device 10e shown in FIG. 10, the curved region 16b of the cover layer 16 protrudes from the peripheral region PR1-1 of the first panel 12, and the curved region 18b of the cover layer 18 protrudes from the peripheral region PR2-1 of the second panel 14. As a result, when the tiled display device 10e is in an unfolded form, the cover layer 16 and the cover layer 18 would contact with each other, and the peripheral region PR1-1 of the first panel 12 and the peripheral region PR2-1 of the second panel 14 would not contact with each other and be spaced apart by a gap 111-2. The gap 111-2 is opposite to the recess 111-1 between the curved region 16b and the curved region 18b.

Please continue to refer to FIG. 10. When Equation 6 as shown below is satisfied, the impact of the dark regions caused by the peripheral region PR1-1 and the peripheral region PR2-1 upon the display quality may be reduced. A dark region between the second display region AA2 of the first panel 12 and the fourth display region AA4 of the second panel 14 may be less obvious for the user. In this way, the first display region AA1, the second display region AA2, the third display region AA3 and the fourth display region AA4 may collectively form an expanded display region AA.

$$Dn/2 \geq Ln \geq Bn \quad \text{(Equation 6)}$$

In Equation 6, the width Dn, the width Bn and the distance Ln represent either the group of the width D1, the width Bn and the distance L1 of the projections of the first panel 12 and the corresponding cover layer 16 on the horizontal plane HSP or the group of the width D2, the width Bn and the distance L2 of the projections of the second panel 14 and the corresponding cover layer 18 on the horizontal plane HSP.

Furthermore, the present disclosure may reduce the sense of image discontinuity or tiling line and/or image stretching or distortions caused by refraction by the cover layers by optimizing the curve between the curve starting point P1 and the curve end point P2 of the curved region 16b of the cover layer 16 and the curve between the curve starting point P1 and the curve end point P2 of the curved region 18b of the cover layer 18. According to some embodiments, the curve between the curve starting point P1 and the curve end point P2 of the curved region 16b and the curve between the curve starting point P1 and the curve end point P2 of the curved region 18b may be respectively designed as an arc curve CV. According to some embodiments, the arc curve CV may be an elliptic curve, but is not limited thereto.

For example, please refer to the curved region 16b of the cover layer 16 shown in FIG. 10. The middle point I is the middle point of the cutting line between the curve starting point P1 and the curve end point P2. The intersection point K is the intersection of the tangent line TL1 tangent to the arc curve CV at the curve starting point P1 and the tangent line TL2 tangent to the arc curve CV at the curve end point P2. The intersection point J is the intersection of the arc curve CV and the connecting line between the middle point I and the intersection point K. The middle point I and the intersection point K include a distance K1. The middle point I and the intersection point J include a distance J1.

According to some embodiments of the present disclosure, the planar region 16a of the cover layer 16 is on the tangent line TL1. The contact region CR is on the tangent line TL2.

When Equation 7 as shown below is satisfied, the sense of image discontinuity caused by the dark region near the tiling line may be reduced and the display quality may be further improved.

$$0 \leq J1/K1 \leq 1 \quad \text{(Equation 7)}$$

According to an embodiment of the present disclosure, the value of J1/K1 may be between 0.2 and 0.6. According to an embodiment of the present disclosure, the value of J1/K1 is approximate to 0.4. According to an embodiment of the present disclosure, when the curve between the curve starting point P1 and the curve end point P2 is approximately an elliptic curve, a better effect for improving display quality may be achieved.

In summary, the present disclosure may reduce the impact of the dark region between the two tiled panels observed on user's experiences through the designs of the cover layers. Furthermore, the present disclosure may improve the rainbow patterns and/or image distortions near the splice region through the designs of the pixels. According to the present disclosure, a better display quality of the tiled display device may be achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A tiled display device, comprising:
   two panels, respectively comprising a light emitting region and a peripheral region, and the peripheral regions of the two panels are disposed adjacent to each other along a tiling direction; and
   two cover layers respectively disposed on the two panels and comprising a planar region and a curved region, wherein each of the planar region corresponds to the light emitting region of one of the two panels, and each of the curved region corresponds to the peripheral region of one of the two panels, wherein:
   the curved region of one of the two panels comprises an arc curve between a curve starting point and a curve end point;
   a cutting line between the curve starting point and the curve end point has a middle point I;
   a tangent line tangent to the arc curve at the curve starting point and a tangent line tangent to the arc curve at the curve end point have an intersection point K; and
   a connecting line between the middle point I and the intersection point K and the arc curve have an intersection point J, wherein the middle point I and the intersection point K have a distance K1, the middle point I and the intersection point J has a distance J1, and the distance K1 and the distance J1 satisfy the equation:

$$0 \leq J1/K1 \leq 1.$$

2. The tiled display device according to claim 1, wherein the value of J1/K1 is between 0.2 and 0.6.

3. The tiled display device according to claim 1, wherein the planar region of one of the two cover layers is on the tangent line tangent to the arc curve at the curve starting point.

4. The tiled display device according to claim 1, wherein the two cover layers comprise a contact region, and the curved regions of the two cover layers contact each other in the contact region.

5. The tiled display device according to claim 4, wherein the contact region is on the tangent line tangent to the arc curve at the curve end point.

6. The tiled display device according to claim 4, wherein a top portion of the contact region overlaps the curve end point of one of the two cover layers.

7. The tiled display device according to claim 4, wherein the curved regions of the two cover layers have a recess disposed therebetween, the peripheral regions of the two panels have a gap disposed between, and the recess and the gap are opposite to each other.

8. The tiled display device according to claim 7, wherein the two panels are spaced apart from each other by the gap.

9. The tiled display device according to claim 1, wherein along the tiling direction, one of the two cover layers protrudes from an edge of one of the two panels.

10. The tiled display device according to claim 9, wherein one of the two panels has a width Dn, the curved region of one of the two cover layers has a width Ln, the peripheral region of the one of the two panels has a width Bn, the one of the two panels is corresponding to the one of the two cover layers, and the width Dn, the width Ln and the width Bn satisfy the equation:

$$Dn/2 \geq Ln \geq Bn.$$

\* \* \* \* \*